US007864074B2

United States Patent
Sun (10) Patent No.: US 7,864,074 B2
(45) Date of Patent: *Jan. 4, 2011

(54) DATA DRIVER USED IN A CURRENT-DRIVING DISPLAY DEVICE

(75) Inventor: Wein-Town Sun, Kao-Hsiung (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 1490 days.

This patent is subject to a terminal disclaimer.

(21) Appl. No.: 10/707,243

(22) Filed: Dec. 1, 2003

(65) Prior Publication Data

US 2004/0174283 A1 Sep. 9, 2004

(30) Foreign Application Priority Data

Mar. 7, 2003 (TW) .................... 092105011

(51) Int. Cl.
H03M 1/22 (2006.01)
H03M 1/00 (2006.01)

(52) U.S. Cl. .................... 341/1; 341/136; 341/135; 341/144

(58) Field of Classification Search .................... 341/1, 341/136, 144, 135
See application file for complete search history.

(56) References Cited

U.S. PATENT DOCUMENTS

| 4,967,140 | A | 10/1990 | Groeneveld et al. |
| 5,703,582 | A | 12/1997 | Koyama et al. |
| 6,222,357 | B1 | 4/2001 | Sakuragi |
| 6,295,233 | B1 * | 9/2001 | Kim et al. .............. 365/189.11 |
| 6,650,060 | B2 | 11/2003 | Okuda |
| 6,690,367 | B2 | 2/2004 | Akimoto |
| 2004/0174282 | A1 * | 9/2004 | Sun et al. .................... 341/136 |

FOREIGN PATENT DOCUMENTS

| CN | 1391201 A | 1/2003 |
| JP | S62-122488 U | 8/1987 |
| JP | H02-105907 A | 4/1990 |
| JP | H08-288848 A | 11/1996 |
| JP | 2000-081920 A | 3/2000 |
| JP | 2002-215095 A | 7/2002 |
| JP | 2002-351404 A | 12/2002 |
| JP | 2002-366076 A | 12/2002 |

* cited by examiner

Primary Examiner—Jean B Jeanglaude
(74) Attorney, Agent, or Firm—Winston Hsu; Scott Margo (57) ABSTRACT

A data driver used in a current-driving display device for receiving a digital signal and for outputting a gray-scaled current signal to a data line. The data driver includes a digital-to-analog current converter for transforming the digital signal into an analog current signal, a current-copying/reproducing module, and a control circuit. The current-copying/reproducing module is used to store a predetermined voltage for conducting the analog current signal in a transforming/storing status and to conduct a reproducing current signal to the data line in a reproducing/sustaining status. The control circuit is electrically connected between the digital-to-analog current converter and the current-copying/reproducing module for providing a switch between the transforming/storing status and the reproducing/sustaining status. The reproducing current signal is the gray-scaled current signal and is almost equivalent to the analog current signal.

17 Claims, 9 Drawing Sheets

DATA DRIVER USED IN A CURRENT-DRIVING DISPLAY DEVICE

BACKGROUND OF INVENTION

1. Field of the Invention

The invention relates to a data driver used in a current-driving display device, and more particularly, to a current-storing/reproducing data driver including a current storing/reproducing module.

2. Description of the Prior Art n OLED (Organic Light Emitting Device, OLED) display can be designed as a thin, flat panel display device. The OLED display can be found in a plethora of electronic goods, ranging from notebook computers and digital cameras, to flight avionics and medical diagnostic tools. OLEDs offer crisp, high-resolution images, and have the primary advantage of offering relatively low power-consumption rates while still maintaining good color contrast and screen refresh rates. The OLED is an electrically driven lighting element having a brightness that depends on the magnitude of a related current. At present, the magnitude of the brightness (which is also called the gray-scale value) is controlled by the magnitude of the OLED driving current in an application OLED matrix display.

Base upon the driving method, the matrix display can be classified as either a passive matrix or an active matrix display. Passive matrix displays adopt the method of driving the scan lines of the display in sequence, driving pixels in different rows sequentially. Since the light-emitting time of each pixel is restricted by the scanning frequency and the numbers of scan lines, the passive matrix method is not suitable for large-sized and high dots-per-inch (dpi) displays. Active matrix displays, however, possess an independent pixel circuit for each pixel, which is described in FIG. 1, which is a schematic diagram of a pixel 20. The present embodiment of the pixel 20 includes a capacitor C1, an OLED D, and a plurality of MOS transistors or TFTs(Thin-film Transistors) T1-T4. With this arrangement, even in large-sized and high dpi displays, a steady driving current I is provided for each pixel, which improves the brightness balance.

Figure 1:
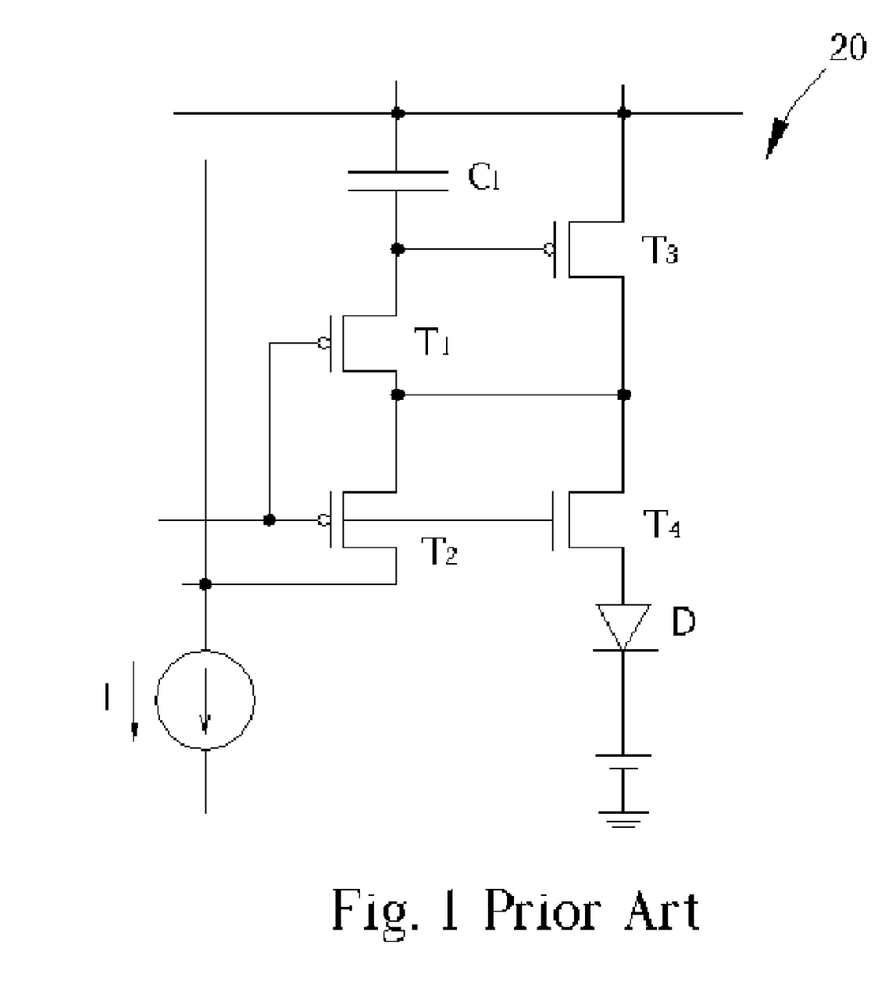
FIG. 1 is a schematic diagram of a pixel according to the prior art.
Figure 2:
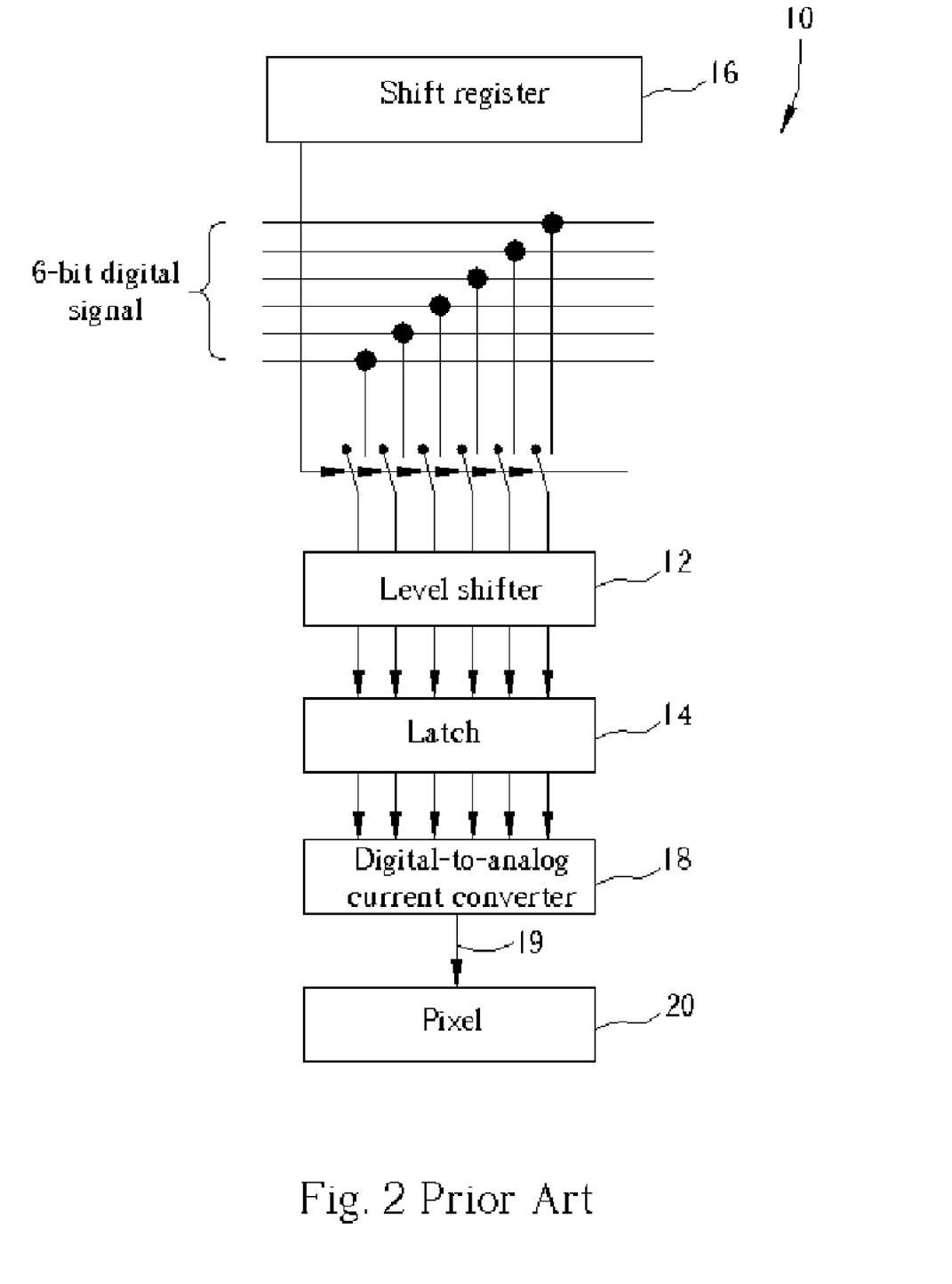
FIG. 2 is a functional block diagram of a data driver according to the prior art.

For achieving advantages of power saving, integrity, and cost effectiveness, more OLED systems adopt the digital type as an input data type so that the digital-to-analog converter should be involved in the data driver. In addition, the brightness of the OLED display is controlled by current. Therefore, the digital-to-analog process should be achieved by a digital-to-analog current converting circuit to convert digital data into an analog current signal. The corresponding pixel is also a current-driving pixel as the pixel 20 shows in FIG. 1. Please refer to FIG. 2, which is a functional block diagram of a prior-art data driver 10. The data driver 10 corresponds to the pixel 20 of a display device as shown in FIG. 1. The data driver 10 includes a level shifter 12, a latch 14, a shift register 16, and a digital-to-analog current converter 18. The level shifter 12 is used to adjust the potential levels of a received digital signal (a 6-bit digital signal), and the latch 14 is electrically connected to the level shifter 12 for storing and buffering the digital signal. The latch 14 can temporarily store the 6-bit the digital signal so that the latch 14 is a 6-bit latch. The shift register 16 can be used to generate a shift-register signal to transmit the digital signal to the level shifter 12 at one time. Afterwards, the level shifter 12 will execute the potential-level adjusting and buffering functions and transmit the digital signal to the latch 14. The digital-to-analog current converter 18 is connected to the latch 14 for receiving the digital signal outputted from the latch 14. The digital-to-analog current converter 18 can be used to transform the digital data into an analog current signal and to output the analog current signal to a data line 19. According to the amplitude of the analog current signal, the gray colors of the display panel can be determined.

Figure 3:
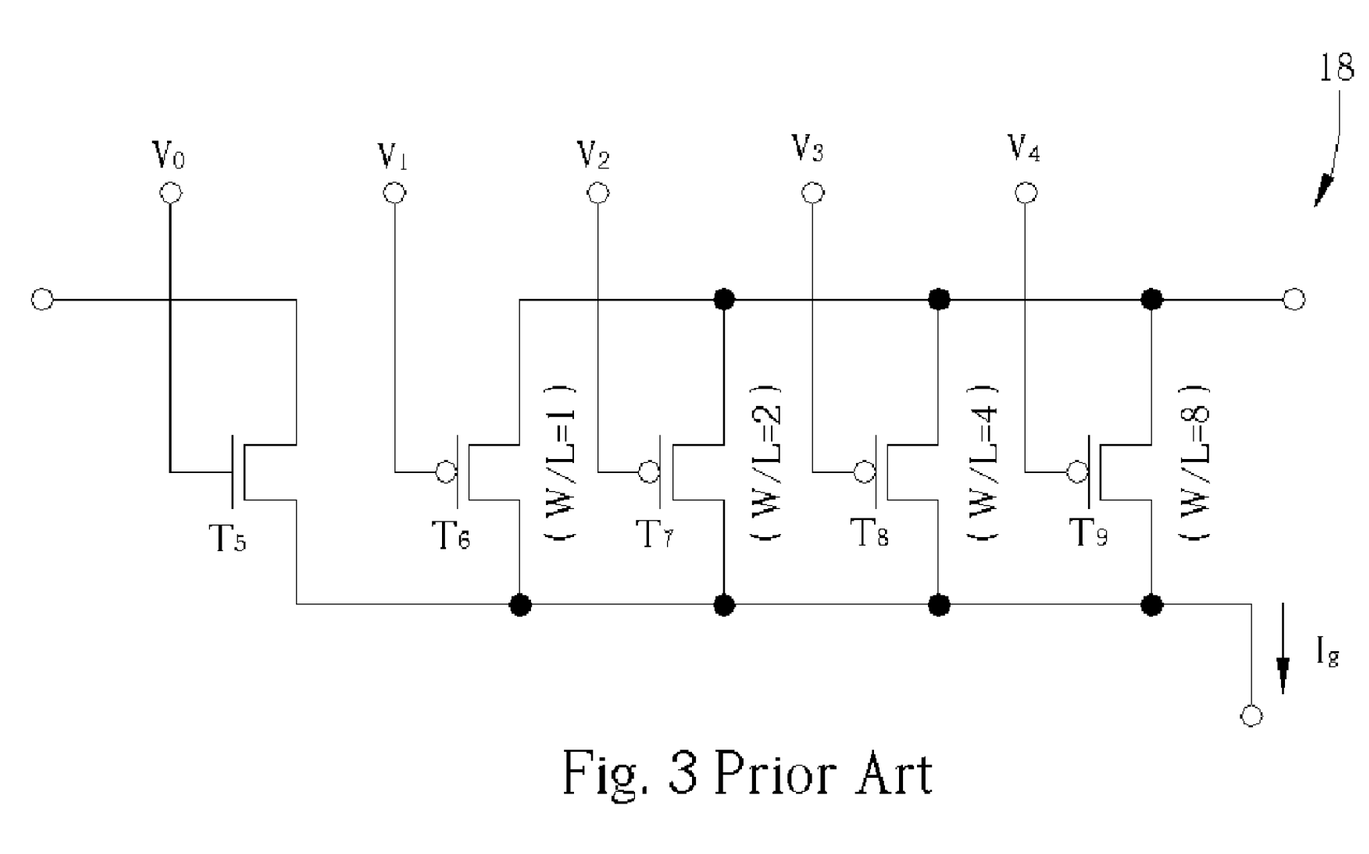
FIG. 3 is a schematic diagram of an embodiment of a prior-art digital-to-analog current converter as shown in FIG. 2.

Taking a display panel with 4-bit input digital data as an example, J. Kanicki et.al. (U. of Michigan, USA) has disclosed a simple digital-to-analog current converter installed with a set of TFTs (Thin Film Transistors) with a width-to-length ratio assigned as 1:2:4:8 and a current source to generate 16 current gray scales, I. Please refer to FIG. 3, which is a schematic diagram of an embodiment of a prior-art digital-to-analog current converter 18. The digital-to-analog current converter 18 is composed of a plurality of transistors T5-T9. Due to that the 16 current gray scales rely on 4 (1:2:4:8) TFTs T6-T9, any fluctuation of threshold potential level and mobility in each TFT will generate significant variation to affect the current gray scales. Furthermore, the quality of the corresponding panel will be influenced. In addition, because the output impedance of the digital-to-analog current converter 18 is not high enough, the output potential level will be affected by a current flow passing the digital-to-analog current converter 18. Therefore, when the digital-to-analog current converter 18 is connected to the corresponding pixel, the output current may not be a stable 16 gray-scale current.

SUMMARY OF INVENTION

It is therefore a primary objective of the claimed invention to provide a current storing/reproducing data driver to conduct a stable duplicate current signal in a reproducing/sustaining status to solve the above-mentioned problems.

According to the claimed invention, a data driver used in a current-driving display device for receiving a digital signal and for outputting a gray-scale current signal to drive a data line of the display devices disclosed. The data driver comprises a digital-to-analog current converter for transforming the digital signal into an analog current signal; a current storing/reproducing module for storing a predetermined voltage required for conducting the analog current signal in a transforming/storing status, and for conducting a duplicate current signal to the data line in a reproducing/sustaining status; and a control circuit electrically connected between the digital-to-analog current converter and the current storing/reproducing module for providing a switch between the transforming/storing status and the reproducing/sustaining status; wherein the duplicate current signal is the gray-scale current signal, and the duplicate current signal is almost equal to the analog current signal.

According to the claimed invention, a data driver used in a current-driving display device for receiving a digital signal and for driving a data line of the display device is disclosed. The data driver comprises at least a level shifter for adjusting voltage levels of the digital signal; a current-steering digital-to-analog current converter electrically connected to the level shifter for transforming the digital signal into an analog current signal; a current storing/reproducing module for storing a predetermined voltage required for conducting the analog current signal in a transforming/storing status, and for conducting a duplicate current signal to the data line in a reproducing/sustaining status, wherein the duplicate current signal is generated by the predetermined voltage; and a control circuit electrically connected between the digital-to-analog current converter and the current storing/reproducing module for providing a switch between the transforming/storing status and the reproducing/sustaining status; wherein the duplicate current signal is almost equal to the analog current signal.

These and other objectives of the present invention will no doubt become obvious to those of ordinary skill in the art after reading the following detailed description of the preferred embodiment, which is illustrated in the various figures and drawings.

DETAILED DESCRIPTION

Figure 4:
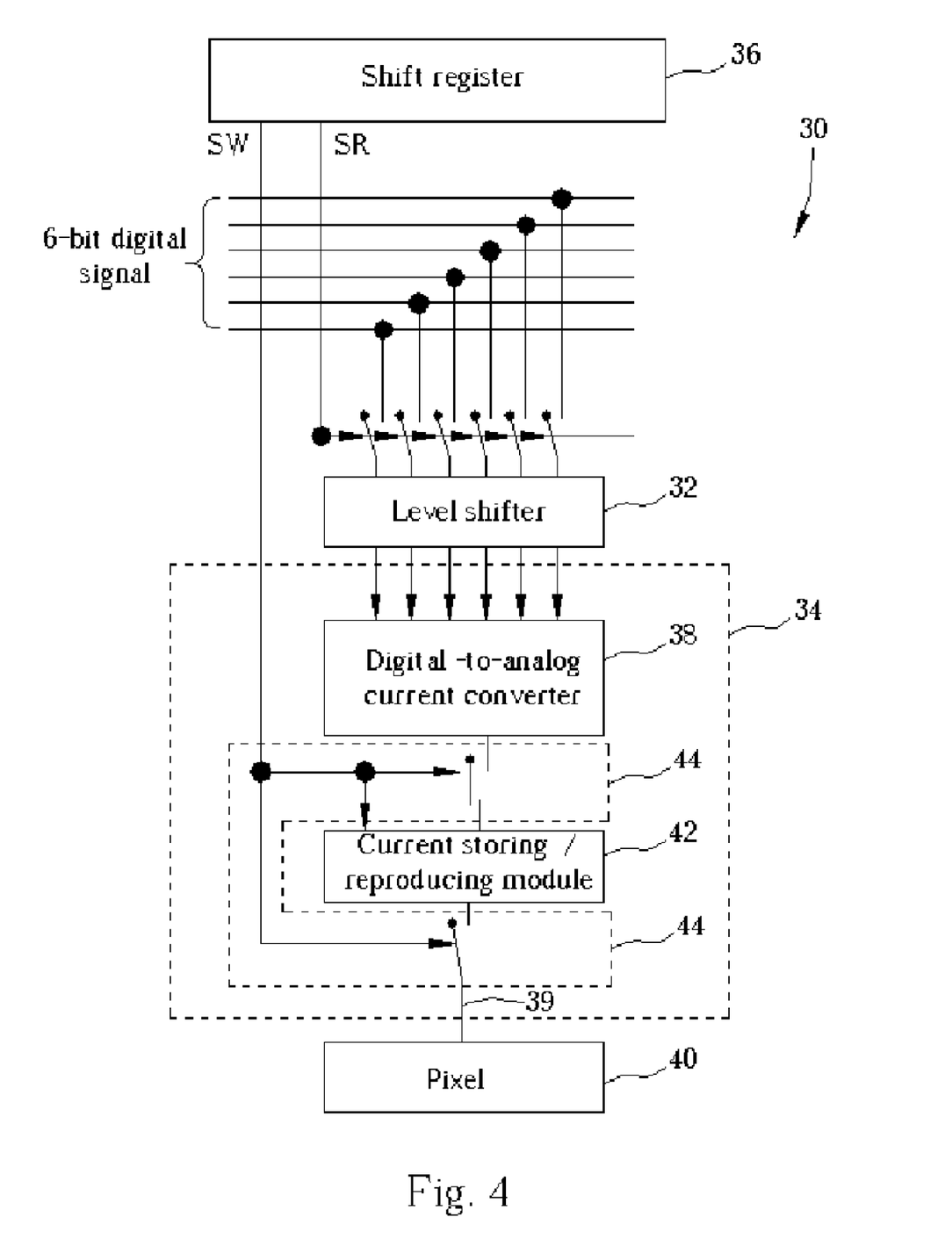
FIG. 4 is a functional block diagram of a data driver according to the present invention.

Please refer to FIG. 4, which is a functional block diagram of a data driver 30 according to the present invention. The data driver 30 corresponds to a pixel 40 of a display device. The data driver 30 includes level shifter 32, a shift register 36, a digital-to-analog current converter 38, a current storing/reproducing module 42, and a control circuit 44, wherein the digital-to-analog current converter 38, the current storing/reproducing module 42, and the control circuit 44 can be treated as a novel digital-to-analog current converting circuit 34. The level shifter 32 is used to adjust the potential levels of a received digital signal (a 6-bit digital signal) and to buffer the digital signal. The shift register 36 can be used to generate a shift-register signal SR and a switch signal SW. The shift-register signal SR is used to transmit the digital signal to the level shifter 32 at one time, and the level shifter 32 can execute adjusting and buffering functions and then deliver the digital signal to the digital-to-analog current converter 38. The digital-to-analog current converter 38 is used to transform the received digital signal into an analog current signal, and the current storing/reproducing module 42 is used to store a predetermined voltage required for conducting the analog current signal in a transforming/storing status and conduct a duplicate current signal to a data line 39 in a reproducing/sustaining status. The switch operation between transforming/storing status and reproducing/sustaining status is achieved by the switch signal SW and the control circuit 44. The data line 39 is connected to the pixel 40. The data driver 30 is used to control the gray colors of the display panel according to the duplicate current signal, which is a grayscale current signal.

Please notice that, in the present embodiment, the quantity of the level shifter 32 should not be limited. When being implemented, the level shifter 32 can be replaced by a latch circuit. Moreover, the switch signal SW can be generated by the shift register or other control module. Please refer to FIG. 5, which is a functional block diagram of another embodiment of the data driver 30 as shown in FIG. 4. The only difference between the embodiments in FIG. 4 and FIG. 5 is that the switch signal SW shown in FIG. 5 is generated by other external control module instead of the shift register 36 shown in FIG. 4.

Figure 5:
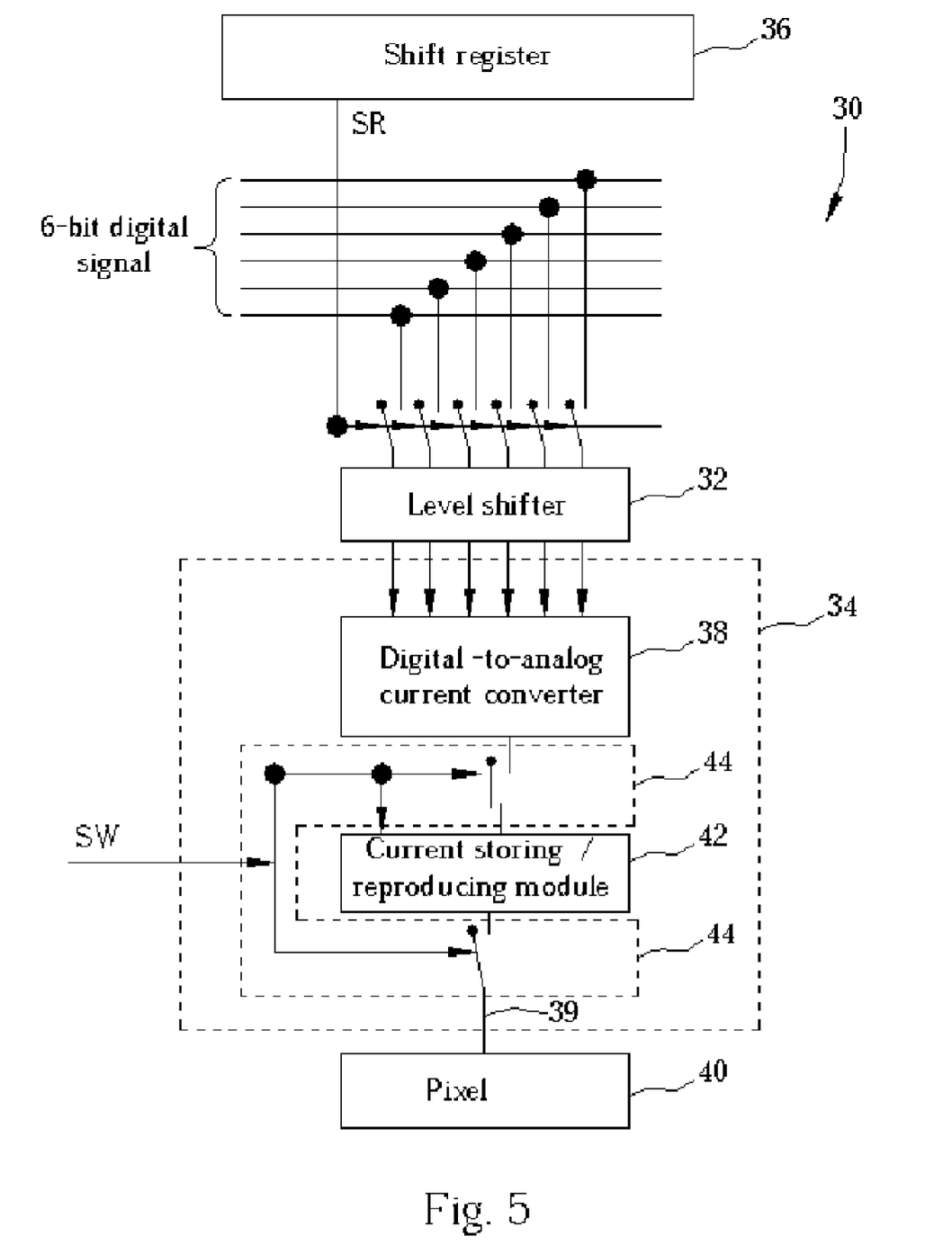
FIG. 5 is a functional block diagram of another data driver according to the present invention.
Figure 6:
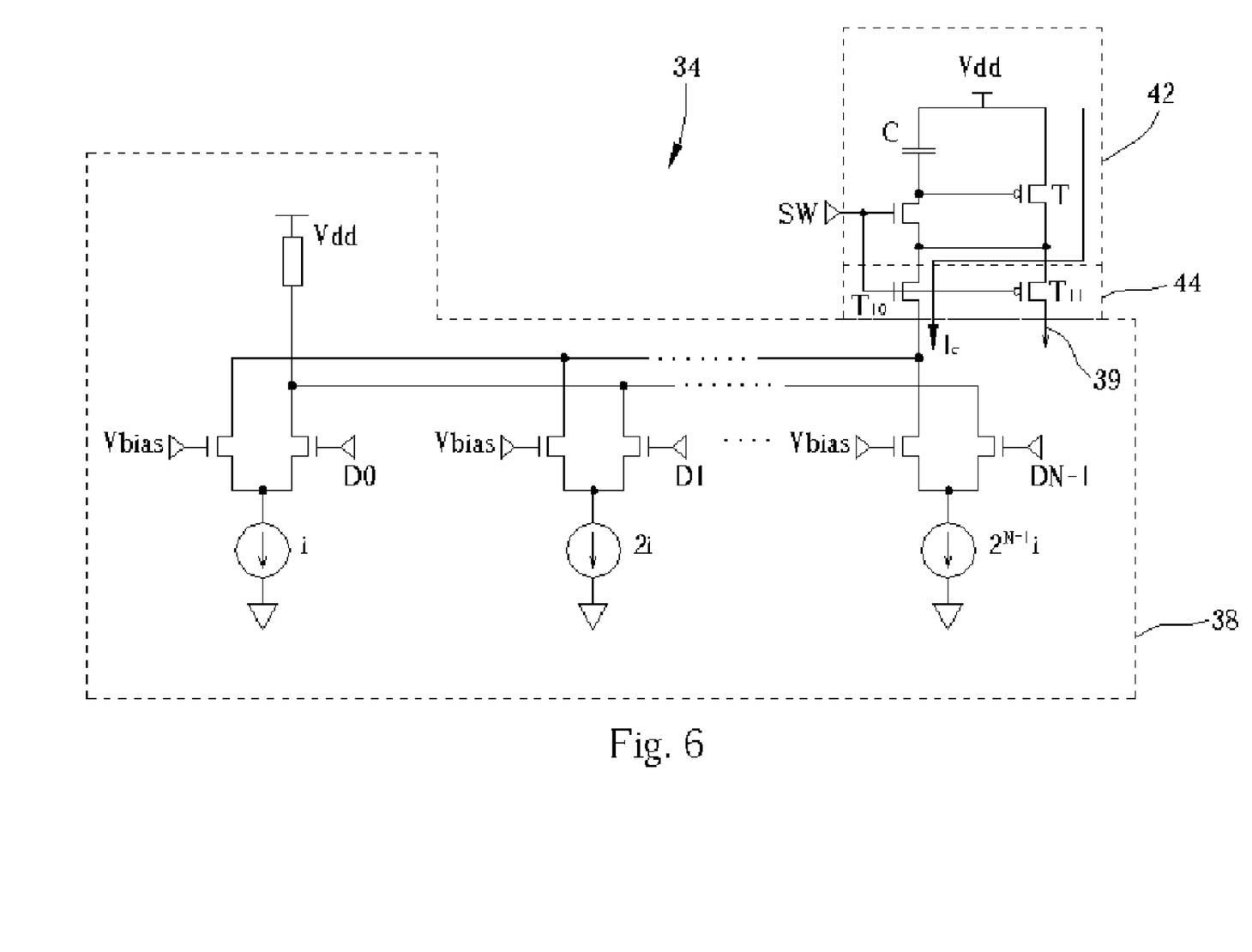
FIG. 6 is a schematic diagram of a detailed embodiment of the digital-to-analog current converting circuit in a transforming/storing status.

Please refer to FIG. 6, which is a schematic diagram of a detailed embodiment of the digital-to-analog current converting circuit 34 as shown in FIG. 4 and FIG. 5. The digital-to-analog current converter 38 is a current-steering digital-to-analog current converter 38 with higher output impedance for preventing the influence of the current flow of the digital-to-analog current converter 38. The control circuit 44, which is electrically connected between the digital-to-analog current converter 38 and the current storing/reproducing module 42, can be conceptually composed of two transistors T10, T11. The control circuit 44 is used to receive a switch signal SW, and to switch the digital-to-analog current converting circuit 34 between the transforming/storing status and the reproducing/sustaining status according to the switch signal SW. In addition, the current storing/reproducing module 42 of the present embodiment includes a capacitor C and a plurality of MOS (Metal-Oxide Semiconductor) transistors, wherein the capacitor C is used to store the predetermined voltage required for conducting the analog current signal. After being provided with some proper external voltage sources, current sources (i, 2i . . . $2^{N-1}$i), data input (D0, D1 . . . DN−1), and ground level, the digital-to-analog current converting circuit 34 can operate well.

Please continue to refer to FIG. 6. When the switch signal SW received by the control circuit 44 is at a high potential level, the digital-to-analog current converting circuit 34 is in the transforming/storing status. The digital signal will be transformed into a corresponding analog current signal by the digital-to-analog current converter 38. In the transforming/storing status, the transistor T11 is turned off, and the control circuit 44 will disconnect the route to the data line 39 and turn on the transistor T10 to connect the digital-to-analog current converter 38 to the current storing/reproducing module 42. The analog current signal (the arrow Ic) will be conducted into the current storing/reproducing module 42. The analog current signal will pass the capacitor C and the PMOS transistor T in the current storing/reproducing module 42 to make the capacitor C store the predetermined voltage required for conducting the analog current signal. Therefore, in the present embodiment, the predetermined voltage is a gate-to-source voltage drop (Vgs) of the PMOS transistor T. Please notice that the current storing/reproducing module 42 can be composed of MOS transistors or TFTs. Actually, the type of transistors should not be limited, and the combination among the transistors and the capacitor C is flexible. With different circuit combinations, the design of potential level of the switch signal SW can be adjusted.

Figure 7:
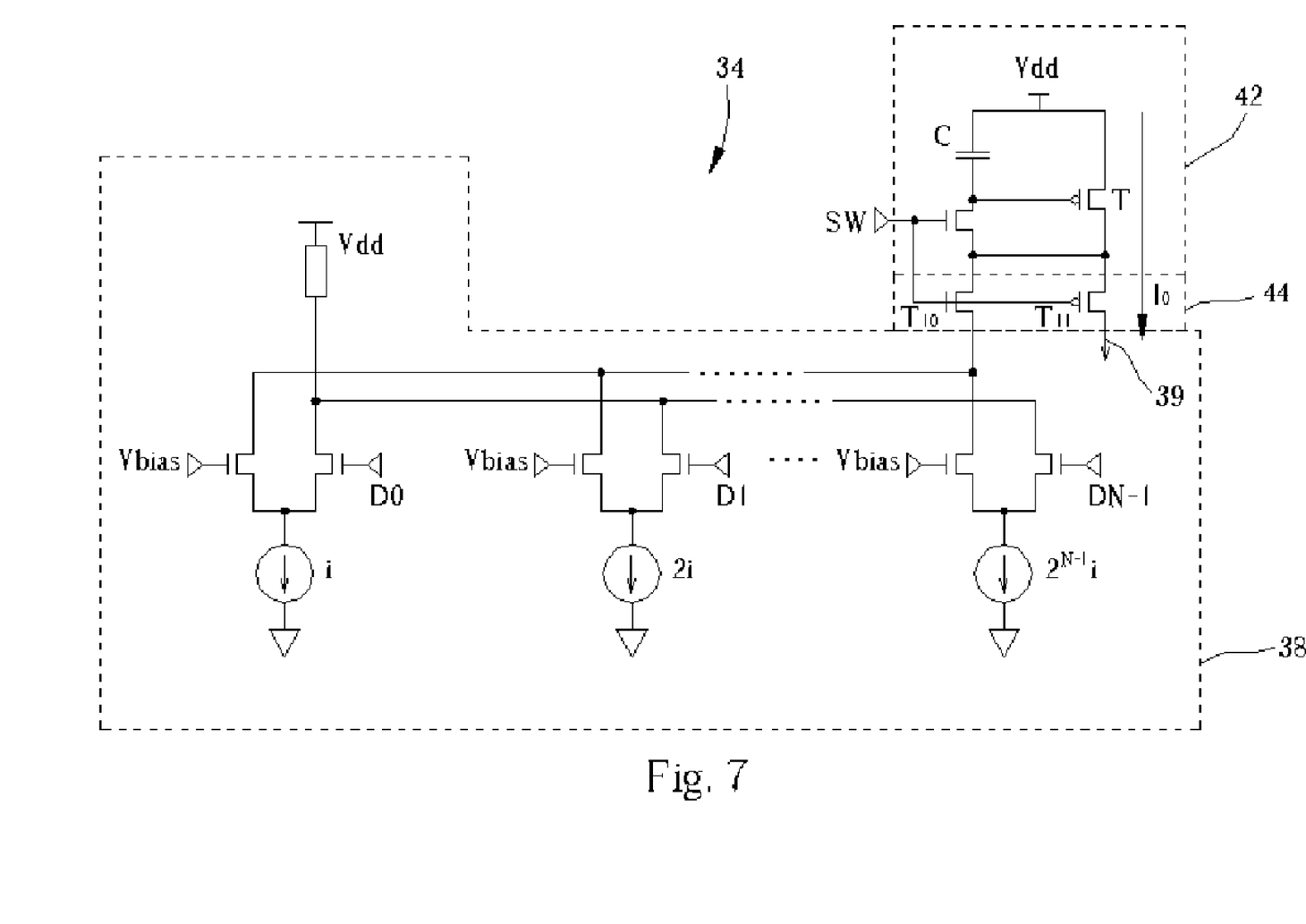
FIG. 7 is a schematic diagram of a detailed embodiment of the digital-to-analog current converting circuit in a reproducing/sustaining status.

When the switch signal SW goes back to a low potential level, the digital-to-analog current converting circuit 34 is in the reproducing/sustaining status. The operation related to the digital-to-analog current converting circuit 34 in the reproducing/sustaining status can refer to FIG. 7, which is a functional block diagram of another embodiment of the digital-to-analog current converting circuit 34 as shown in FIG. 6. FIG. 7 also shows the condition of the digital-to-analog current converting circuit 34 in the reproducing/sustaining status. In the present embodiment, after the control circuit 44 executes the corresponding switch function (the switch signal SW switches from the high potential level to the low potential level), the transistor T11 is turned on, and the current storing/ reproducing module 42 will conduct a duplicate current signal to the data line 39 in the reproducing/sustaining status. When the digital-to-analog current converting circuit 34 is in the reproducing/sustaining status, the control circuit 44 (used to receive the low-potential-level switch signal SW) will disconnect the route between the digital-to-analog current converter 38 (by turning off the transistor T10) and the current storing/reproducing module 42. Then the duplicate current signal will be conducted to the data line 39 to drive the data line 39 and the corresponding pixel 40. The duplicate current signal is generated by the predetermined voltage previously stored in the current storing/reproducing module 42 in the transforming/storing status. Due to that the predetermined voltage is required to conduct the analog current signal, the duplicate current signal is almost equal to the analog current signal generated by the digital-to-analog current converter 38. Please notice that the type of transistors should not be limited, and the combination among the transistors and the capacitor C is flexible. With different circuit combinations, the design of potential level of the switch signal SW can be adjusted. Moreover, the directions of the current flow described in FIG. 4 to FIG. 6 is relative. The direction of the current flow in the reproducing/sustaining status represents that the digital-to-analog current converting circuit 34 plays a role as a current source. If the direction of the current flow is designed reversed, the system should be designed with corresponding modifications.

The above-mentioned data driver can be viewed as "a grade data driver" corresponding to a pixel. However, when being implemented, each grade data driver of pixel corresponds to more than a pixel, that is, a data line is connected to a plurality of pixels. In addition, if we want to apply the data driver of the present invention to a "matrix display", the best solution is providing a structure of "a plurality of grades of data drivers". Please refer to FIG. 8, which is a functional block diagram of a practical embodiment of a data driver 50 according to the present invention. The data driver 50 is applied in a display device 60, and the display device 60 can be an OLED display device, a PLED display device, or other current-driving display devices. The display device 60 includes a shift register 56, a plurality of grades of data drivers 50, a plurality of pixels 70 corresponding to the plurality of grades of data drivers 50, and a plurality of scan lines 68 corresponding to the plurality of pixels 70. The plurality of pixels 70 are arranged in a matrix form. Each data driver 50 has the same characteristics with the above-mentioned embodiments described in FIG. 4 to FIG. 7. Each data driver 50 includes a level shifter 52, a digital-to-analog current converter 58, a current storing/reproducing module 62, and a control circuit 64. Each pixel 70 is a current storing/reproducing pixel 70, and each switch signal SW can be generated either by the shift register 56 in the present embodiment or by other control devices. When a switch signal SW is at a low potential level, the corresponding data driver 50 is in a reproducing/sustaining status. The switch signal SW will disconnect the route to the digital-to-analog current converter 58 and connect the route to the corresponding data line 69. In the meanwhile, a scan line will start to operate (at a high potential level) to turn on the related pixels 70 coupled to the scan line. Therefore, a transistor connected to a capacitor that is stored with a predetermined voltage in the current storing/reproducing module 62 of the data driver 50 will be turned on to from a route to the data line 69 and the pixels 70. The current storing/reproducing module 62 will be used to conduct a current signal whose magnitude is almost the same as the original analog current signal. Afterwards, the current signal will be conducted to the corresponding pixel 70. After the scan line is turned off, due to that the pixel 70 is a current storing/reproducing pixel 70, the pixel 70 will reproduce a duplicate current signal and conduct the duplicate current signal to an OLED or a PLED in the pixel 70. Therefore, the OLED or the PLED can maintain its illuminating operation until the corresponding scan line 68 is turned on a next time.

Figure 8:
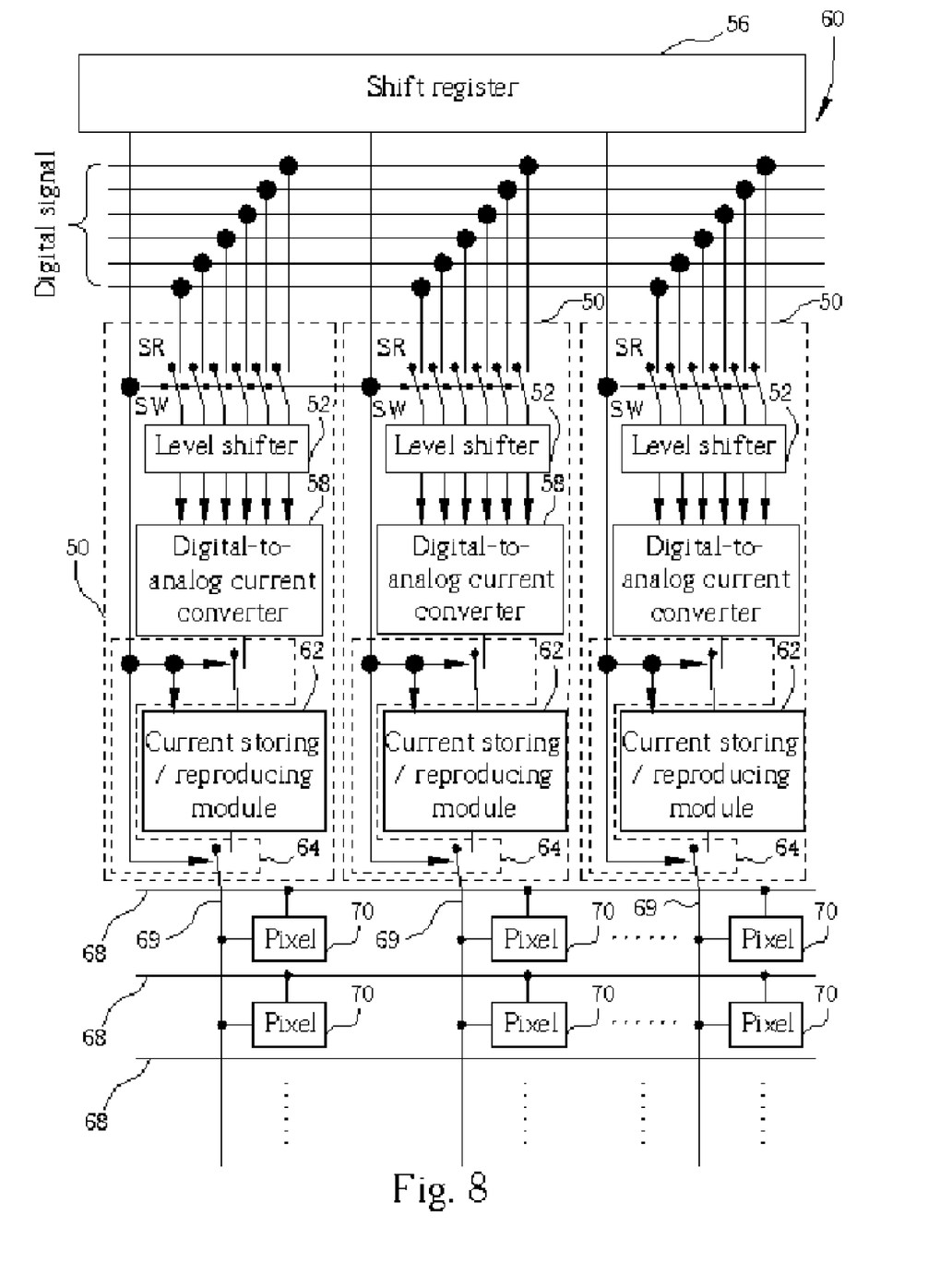
FIG. 8 is a functional block diagram of a practical embodiment of the data driver according to the present invention.
Figure 9:
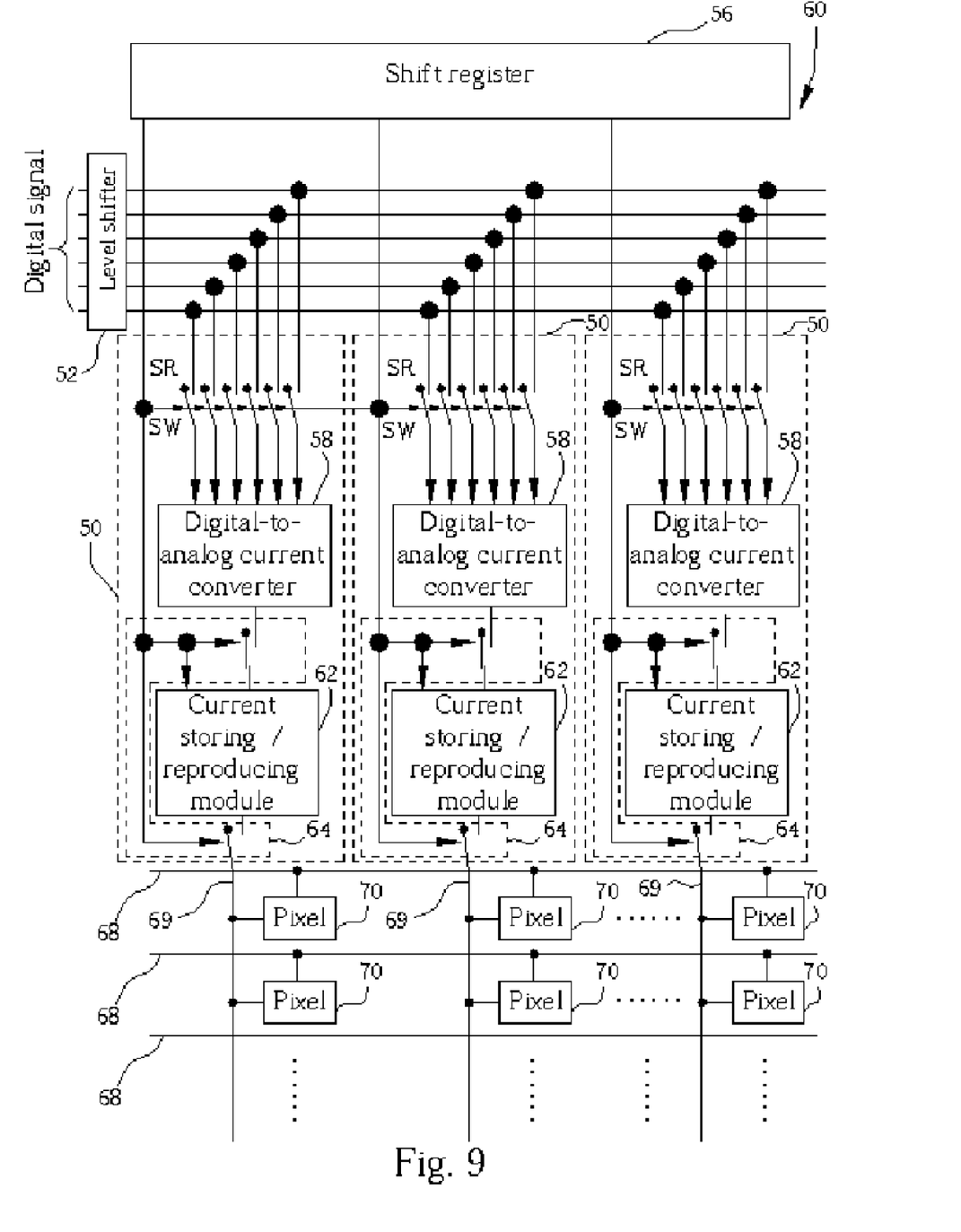
FIG. 9 is a functional block diagram of another practical embodiment of the data driver according to the present invention.

When being implemented, the level shifter 52 or the latch as shown in FIG. 8 can be placed outside the data driver 50, so that the plurality of grades of the data drivers 50 can share the level shifter 52 or the latch. The related structure can refer to FIG. 9, which is a functional block diagram of another embodiment of the display device 60 as shown in FIG. 8. Actually, the quantity of level shifter 52 (or latch) should not be limited.

The data driver of the present invention includes a current-steering digital-to-analog current converter, and has a current-storing/reproducing function by being installed with a current storing/reproducing module and a corresponding control circuit so that the data driver can be used to store a predetermined voltage in a transforming/storing status and to conduct a stable gray-scale current in a reproducing/sustaining status.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data driver used in a current-driving display device for receiving a digital signal and for outputting a gray-scale current signal to drive a data line of the display device, the data driver comprising:
   a digital-to-analog current converter for transforming the digital signal into an analog current signal;
   a current storing/reproducing module for storing a predetermined voltage required for conducting the analog current signal in a transforming/storing status and for conducting a duplicate current signal to the data line in a reproducing/sustaining status; and
   a control circuit electrically connected between the digital-to-analog current converter and the current storing/reproducing module for providing a switch between the transforming/storing status and the reproducing/sustaining status;
   wherein the duplicate current signal is the gray-scale current signal, and the duplicate current signal is almost equal to the analog current signal.

2. The data driver of claim 1, wherein the duplicate current signal is generated by the predetermined voltage.

3. The data driver of claim 1 further comprising at least a level shifter for adjusting voltage levels of the digital signal.

4. The data driver of claim 1 further comprising a shift register for outputting a switch signal to the control circuit to switch the data driver between the transforming/storing status and the reproducing/sustaining status.

5. The data driver of claim 4, wherein if the switch signal is at a high potential level, the data driver is in the transforming/storing status, and the control circuit connects the digital-to-analog current converter to the current storing/reproducing module to conduct the analog current signal generated by the digital-to-analog current converter to the current storing/reproducing module, which stores the predetermined voltage required for conducting the analog current signal.

6. The data driver of claim 5, wherein the current storing/reproducing module comprises at least a capacitor and a plurality of MOS transistors or TFTs, and the predetermined voltage is a gate-to-source voltage drop (Vgs) of a transistor.

7. The data driver of claim 4, wherein if the switch signal is at a low potential level, the data driver is in the reproducing/sustaining status, and the control circuit will disconnect the route between the digital-to-analog current converter and the current storing/reproducing module and conduct the duplicate current signal to the data line.

8. The data driver of claim 1, wherein the digital-to-analog current converter is a current-steering digital-to-analog current converter or another digital-to-analog current converter.

9. The data driver of claim 1, wherein the display device is an OLED display device, a PLED display device, or another current-driving display device.

10. A data driver used in a current-driving display device for receiving a digital signal and for driving a data line of the display device, the data driver comprising:
- at least a level shifter for adjusting voltage levels of the digital signal;
- a current-steering digital-to-analog current converter electrically connected to the level shifter for transforming the digital signal into an analog current signal;
- a current storing/reproducing module for storing a predetermined voltage required for conducting the analog current signal in a transforming/storing status, and for conducting a duplicate current signal to the data line in a reproducing/sustaining status, wherein the duplicate current signal is generated by the predetermined voltage; and
- a control circuit electrically connected between the digital-to-analog current converter and the current storing/reproducing module for providing a switch between the transforming/storing status and the reproducing/sustaining status;

wherein the duplicate current signal is almost equal to the analog current signal.

11. The data driver of claim 10 further comprising a shift register for outputting a switch signal to the control circuit to switch the data driver between the transforming/storing status and the reproducing/sustaining status.

12. The data driver of claim 11, wherein if the switch signal is at a high potential level, the data driver is in the transforming/storing status, and the control circuit connects the digital-to-analog current converter to the current storing/reproducing module to conduct the analog current signal generated by the digital-to-analog current converter to the current storing/reproducing module, which stores the predetermined voltage required for conducting the analog current signal.

13. The data driver of claim 12, wherein the current storing/reproducing module comprises at least a capacitor and a plurality of MOS transistors or TFTs, and the predetermined voltage is a gate-to-source voltage drop (Vgs) of a transistor.

14. The data driver of claim 11, wherein if the switch signal is at a low potential level, the data driver is in the reproducing/sustaining status, and the control circuit will disconnect the route between the digital-to-analog current converter and the current storing/reproducing module and conduct the duplicate current signal to the data line.

15. The data driver of claim 14, wherein the display device further comprises a plurality of pixels corresponding to the data line and a plurality of scan lines corresponding to the plurality of pixels, wherein when the data driver is in the reproducing/sustaining status, at least a scan line will operate the corresponding pixel so that the data line can conduct the duplicate current signal to the corresponding pixel.

16. The data driver of claim 15, wherein each pixel is a current storing/reproducing pixel.

17. The data driver of claim 10, wherein the display device is an OLED display device, a PLED display device, or another current-driving display device.

* * * * *